United States Patent [19]

Mouw

[11] 3,818,385

[45] June 18, 1974

[54] HYBRID JUNCTION AND MIXER OR MODULATOR

[75] Inventor: Robert B. Mouw, Menlo Park, Calif.

[73] Assignee: Aertech, Sunnyvale, Calif.

[22] Filed: Sept. 21, 1972

[21] Appl. No.: 291,008

[52] U.S. Cl. .................. 333/26, 325/442, 333/35, 333/84 M, 333/84 R

[51] Int. Cl. ....... H03h 7/42, H01p 3/08, H02m 5/20

[58] Field of Search ........... 325/442, 445, 446, 499; 333/26; 321/69 W, 84 M, 84 R, 35

[56] References Cited

UNITED STATES PATENTS

| | | | |
|---|---|---|---|
| 3,314,025 | 4/1967 | Buschbeck | 333/26 X |
| 3,492,603 | 1/1970 | Frederick, Jr. | 325/445 X |
| 3,497,832 | 2/1970 | Cohn | 333/26 |
| 3,512,090 | 5/1970 | Mouw | 325/442 |
| 3,706,042 | 12/1972 | Tenenholtz | 325/446 |

OTHER PUBLICATIONS

Mouw–"Broad Band Hybrid Junction & Application to the Star Modulator" Nov. 68, IEEE-Transactions on Microwave Theory & Tech. Vol. MTT-16, No. 11.
"Compensated-Balun;" Oltman, March 66; IEEE–Transactions on Microwave Theory & Techniques pp. 112–119.

*Primary Examiner*—Archie R. Borchelt
*Assistant Examiner*—Marvin Nussbaum

[57] ABSTRACT

A double balanced mixer or modulator utilizing a hybrid junction in which the junction port of the isolated arm is equally excited by two arms connected in parallel to the excited input port. The hybrid junction is formed of compensated baluns which according to one embodiment are connected together with a star arrangement of diodes to form a bias/modulation port resulting in a double balanced mixer or modulator.

8 Claims, 5 Drawing Figures

HYBRID JUNCTION AND MIXER OR MODULATOR

BACKGROUND OF THE INVENTION

This invention relates to hybrid junctions and to double balanced mixers or modulators utilizing such hybrid junctions.

In general, there are known devices of the above character, examples of which include the hybrid coil commonly used in telephone repeater circuits, the ring circuit (sometimes calles a "rat-race"), and the hybrid-T (sometimes called Magic T) waveguide junction. A hybrid junction is generally a four port device which, when properly terminated in external impedances, couples a signal input at either of parts (1) and (2) to ports (3) and (4), but not to the other one of ports (1) and (2). Similarly, a signal input at either ports (3) or (4) is coupled to ports (1) and (2), but not to the other one of ports (3) and (4). In general, hybrid junctions are divided into two broad categories with respect to applications. The first category relates to signal processing in which the ports of the hybrid junction are interconnected to transmission lines or system components. The second major application utilizes devices such as diodes and transistors which are connected to selected ports of the hybrid. One such device is the double balanced mixer or modulator, which is arranged so that two of the four ports of the junction are connected together with other elements to form an overall three port device. In the present discussion the ports of a four port junction will be designated by (1), (2), (3), (4) and the terminals of each port by the number pairs (1, 1'), (2, 2'), (3, 3') and (4, 4'). The third port of the double balanced mixer or modulator constructed from a hybrid junction will be designated by the capital letter (C) and its terminals by the letter pair (C, C').

In general, double balanced mixer-modulators incorporating known hybrid junctions have been limited due to frequency dependence of operation, failure of isolation between appropriate ports, and sensitivity to the conductivity or impedance of sources or loads connected at various ports. Such equipment has also had the disadvantage of requiring large, bulky configurations including two rat-race circuits or two Magic-T circuits. That is, double balanced mixer-modulators require two pairs of balanced terminals, thus requiring that prior art hybrid junctions be utilized in pairs, causing the bulky configurations. In U.S. Pat. No. 3,512,090, issued May 12, 1970 and assigned to the assignee of the present invention, there is disclosed a new and improved type of hybrid junction and double balanced mixer or modulator which overcomes these limitations and disadvantages. A complete discussion of the new and improved hybrid junction may be found in this U.S. Pat. No. 3,512,090, which is hereby incorporated by reference. In particular, FIG. 7 of U.S. Pat. No. 3,512,090 discloses a coaxial transmission line double balanced mixer or modulator where the hybrid junction is formed of coaxial transmission lines with a star diode circuit connected to two ports of the hybrid junction and forming an output port. This configuration functions well as a double balanced mixer or modulator up to frequencies on the order of 12 GHz. The present invention is an improved mixer or modulator utilizing compensated baluns instead of simple coaxial transmission lines to form a hybrid junction and is useful for frequencies up to and above 20 GHz although it also functions well for lower frequencies.

SUMMARY OF THE INVENTION

In general, it is the object of the present invention to provide a new and improved hybrid junction and double balanced mixer or modulator.

It is another object of this invention to provide a hybrid junction mixer or modulator having high isolation between ports and having a broad bandwith and a low VSWR.

It is another object of this invention to provide a hybrid junction coupled, double-balanced mixer or modulator including star connected diodes and having low series inductance whereby circuit resonance is raised as high as possible and by measurement, has been shown to be greater than 18 GHz.

Briefly, in accordance with one embodiment of the invention, there is provided an electromagnetic hybrid junction having first, second, third and fourth compensated baluns. Each of the baluns has first and second ends and comprises a conductor pair in which one conductor of the pair is grounded at both its first and second ends and has an open-circuited portion at the midpoint between first and second ends. The outer conductor of the pair, at the first ends of the first and second baluns are connected in parallel to form a first port to the junction and likewise, the other conductor of the pair at the first ends of the third and fourth baluns are connected in parallel to form a second port to the junction. The second ends of the conductor connected to the first and second ports are terminated in open circuits at the location where the other conductors of the pair are grounded and farthest removed from the ports. Conductors of the conductive pair for each of the baluns which are grounded at their first and second ends, are interconnected adjacent the open-circuited portion to form two terminal pairs defining third and fourth ports. A balanced three port double balanced mixer or modulator is formed by connecting a properly oriented star diode network between a common terminal and the third and fourth port terminal pairs.

These and other features and objects of the invention will appear from the following description and claims when taken in conjunction with the accompanying drawings.

DESCRIPTION OF THE PREFERRED EMBODIMENTS

Compensated baluns are known for converting an unbalanced input terminal pair, one terminal of which is connected to a common shield, or "grounded" to an output balanced with respect to ground. One such balun is described in an article entitled "The Compensated Balun" by George Oltman, IEEE Transactions on Microwave Theory and Techniques, Vol. MTT–14, Nov. 3, page 115, Mar. 1966. Generally, such a compensated balun comprises a transmission line section having what can be referred to in co-axial lines as an inner and an outer conductor separated by a dielectric. In other transmission line types, the conductor which shields the other conductor of the pair would be analogous to "outer conductor" and the shielded conductor would be analogous to "inner conductor." The outer conductor is grounded at each of the ends of the section and has an open-circuited portion intermediate the ends of the section. The transmission line section is thus separated into an impedance matching portion A and a compensating portion B separated from each other by the outer conductor open-circuited portion across which only the inner conductor extends. Each of the portions A and B are approximately one-quarter wavelength long at center frequency. The unbalanced input source terminals are connected with the shielded or ungrounded conductor connected to one end of the inner conductor at portion A with the other end in portion B open. The other terminal of the input source is connected to the outer conductor of portion A at the point of ground. The balanced output (R) is obtained by connecting across the outer conductor open-circuited portions. The portions A and B have respective internal impedances *Za* and *Zb* and an impedance with respect to the outer conductors of each other of *Zab*.

Figure 1:
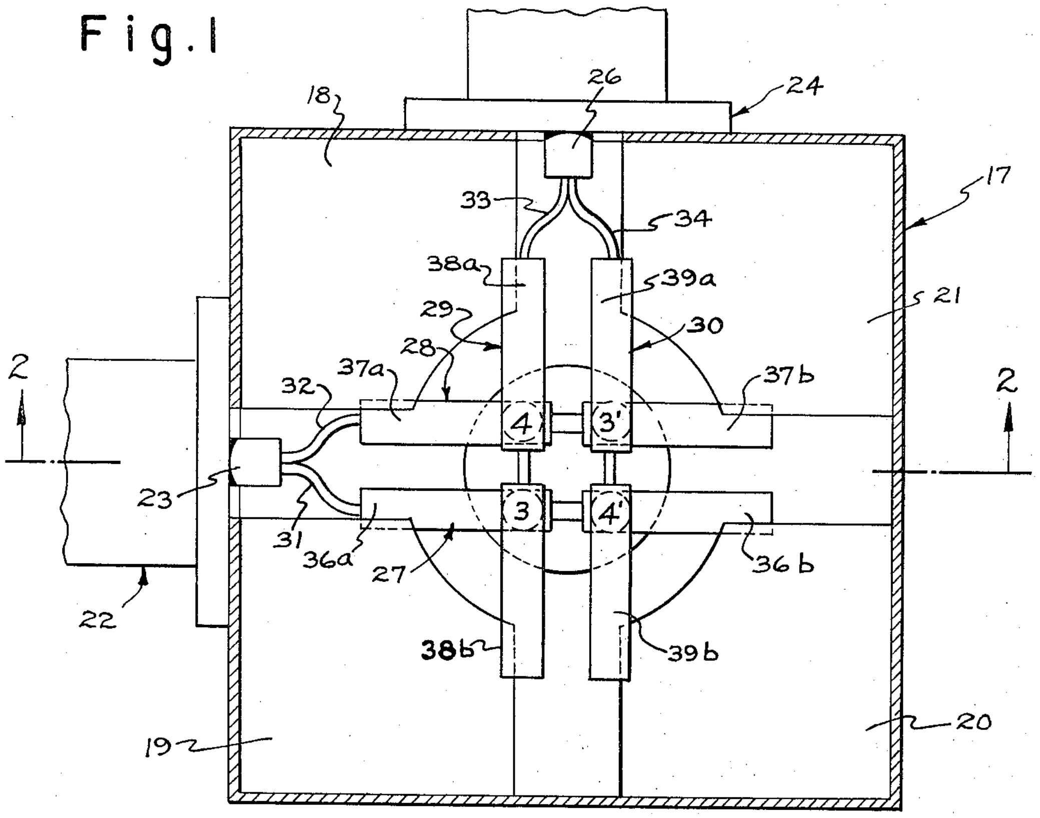
FIG. 1 is a top plan view of a hybrid junction coupled, double-balanced mixer or modulator constructed in accordance with this invention utilizing coaxial line baluns.

Referring now to FIG. 1 there is shown a top plan view of the mechanical arrangement of four compensated baluns arranged to form a hybrid junction. There is provided a housing 17 having interior ground planes 18, 19, 20 and 21. A suitable RF input connector 22 is attached to the housing and has a center conductor 23 which is cooperation with the ground planes 18 and 19 form a terminal pair (denoted 1, 1′) of a first port. An additional suitable RF connector 24 is also attached to the housing 17 and has an inner conductor 26 which in cooperation with the ground planes 18 and 21 form a terminal pair (denoted 2,2′) of a second port. First, second, third and fourth baluns generally indicated by reference numerals 27, 28, 29 and 30, respectively, are provided in the interior of the housing 17. The inner conductor 31 of the first balun at its first end and the inner conductor 32 of the second balun at its first end are connected to the inner conductor 23 of the RF connector 22. Similarly, the inner conductor 33 of the third balun at its first end and the inner conductor 34 of the fourth balun at its first end are connected to the inner conductor 26 of the RF connector 24. The outer conductor 36*a* of the first balun at its first end is connected to the ground plane 19 and the outer conductor 37*a* of the second balun 28 at its first end is connected to the ground plane 18. Similarly, the outer conductor 38*a* of the third balun 29 at its first end is connected to the ground plane 18 and the outer conductor 39*a* of balun 30 at its first end is connected to the ground plane 21. The outer conductor 36*b* of balun 27 at its second end is connected to the ground plane 20, the outer conductor 37*b* of the second balun 28 at its second end is connected to the ground plane 21, the outer conductor 38b of the third balun 29 is connected at its second end to the ground plane 19, and the outer conductor 39*b* of the fourth balun 30 is connected at its second end to the ground plane 20.

The outer conductor 36a of the first balun 27 adjacent the open-circuited portion thereof is connected to the outer conductor 38*b* of the third balun 29 adjacent its open-circuited portion to form a terminal denominated 3. The outer conductor 37*b* of the second balun 28 adjacent the open-circuited portion thereof is connected to the outer conductor 39*a* of the fourth balun 30 adjacent its open-circuited portion to form a terminal denominated 3′. Terminals 3 and 3′ are a terminal pair forming a third port.

The outer conductor 37*a* of the second balun 28 is connected adjacent its open-circuited portion to the outer conductor 38*a* of the third balun 29 adjacent its open-circuited portion to form a terminal denominated 4. The outer conductor 36*b* of the first balun 27 is connected adjacent its open-circuited portion to the outer conductor 39*b* of the fourth balun 30 adjacent its open-circuited portion to form a terminal denominated 4′. The terminals 4 and 4′ are a terminal pair defining a fourth port.

Each of the compensated baluns 28 through 30 has a coaxial portion having an impedance *Za* and a coaxial portion having an impedance *Zb*, with the portions separated by a space across which extends only an inner conductor. The impedance of the transmission lines created by the parallel nature of the outer conductors is denoted *Zab* and a balanced output terminal pair is obtained by connecting across diagonal outer conductor open-circuited end points. Terminals 3,3′ provide one balanced pair, terminals 4,4′ the other balanced pair. Different impedance values are chosen in accordance with the frequency bandwith over which it is desired to operate. The general design criteria are to have Zab as high as possible and to choose Zb such that it compensates the reactance due to *Zab* to yield a 2-pole response in which the input VSWR is minimized over the band of frequencies. As an example of practical values in accordance with one specific embodiment of this invention, the balun impedances and balanced output load resistances were as follows:

$$Za = 100 \text{ ohms}$$

$$Zb = 50 \text{ ohms}$$

$$Zab = 180 \text{ ohms}$$

$$R = 100 \text{ ohms}$$

Figure 2:
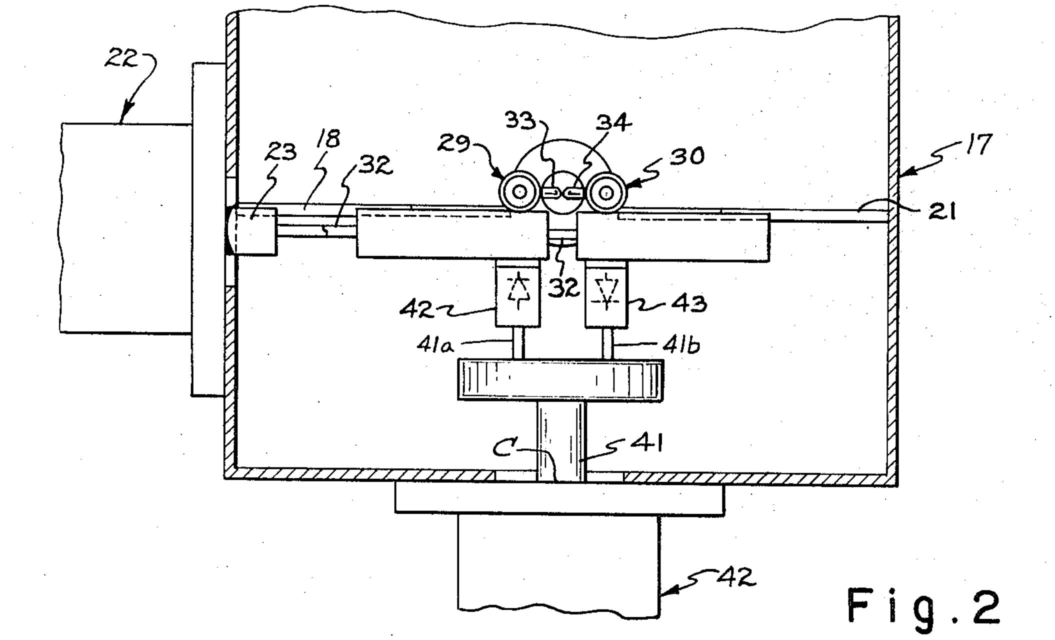
FIG. 2 is a sectional view taken along the line 2—2 of FIG. 1.

FIG. 2 is a sectional view taken along the lines 2—2 of FIG. 1 and further illustrates connection of a star diode with the hybrid junction of FIG. 1 to form a double balanced mixer or modulator. A diode pedestal 41 makes electrical contact with an inner conductor of a suitable RF connector 42 and forms an output port C. The diode pedestal is adapted to contact pill diodes arranged in a star configuration (two of which diodes 42 and 43 are shown in FIG. 2). The arrangement includes at least four diodes connected together in a star configuration in which one end of each diode is connected to a common terminal (port C) and the other end of each diode is connected to one of the terminals of the third and fourth ports, the diodes being oriented such that pairs of diodes connected across a third or fourth port (diagonal) terminal pair are in opposed conduction, whereas diode pairs connected across terminals, one of which is a third port terminal, the other of which is a fourth port terminal (adjacent terminals) are in a conduction direction to form a double balanced three port double balanced mixer or modulator. Note that the diodes are connected only to the outer conductors of the coaxial balun transmission line sections and are not directly connected to any of the inner conductors. This considerably reduces series inductance of the circuit and has enabled construction of double balanced three port mixers or modulators useful at frequencies in excess of 20 GHz.

Figure 3:
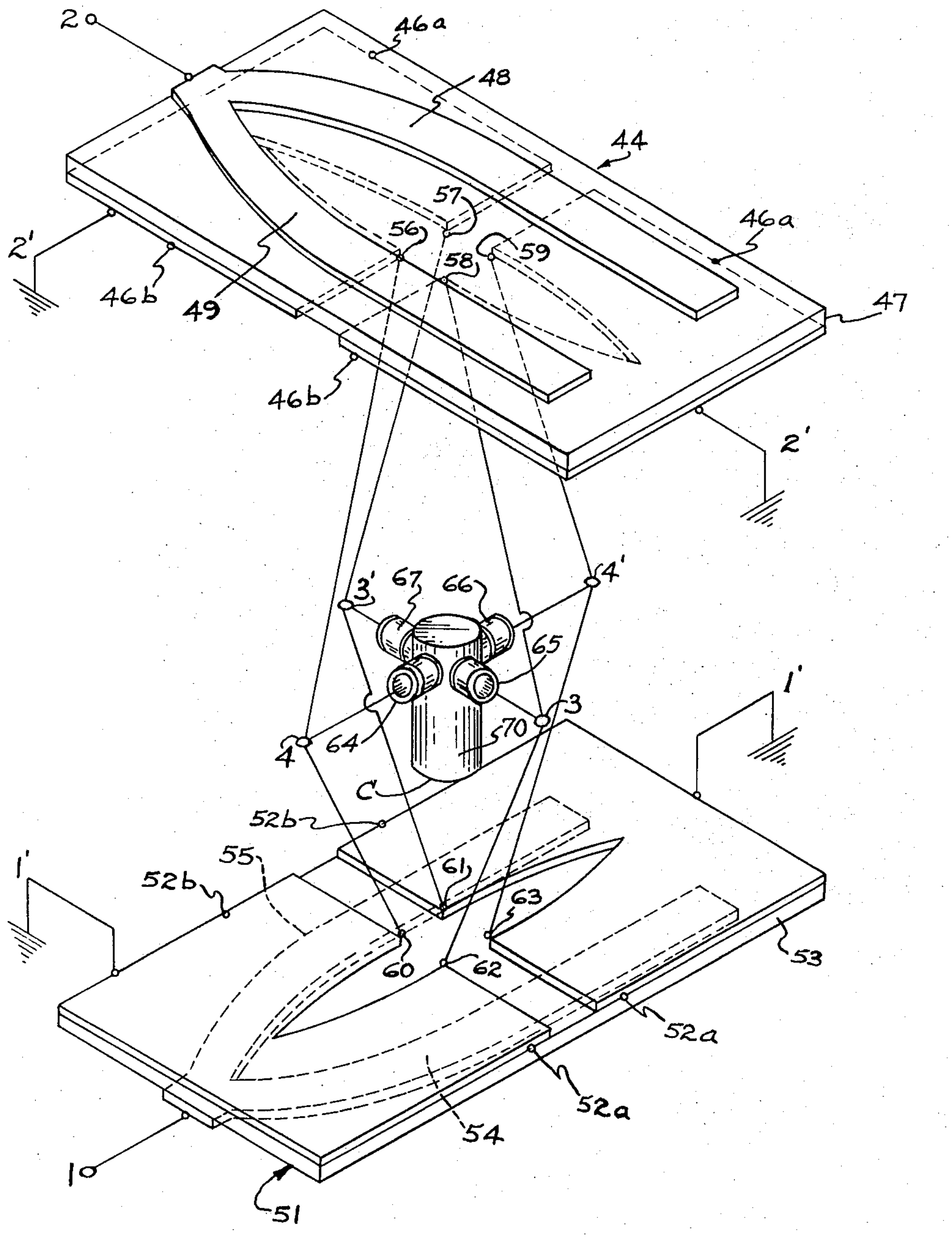
FIG. 3 is an exploded view of a hybrid junction coupled, double balanced mixer or modulator in accordance with this invention constructed using microstrip or strip line baluns.

Referring now to FIG. 3 there is shown an exploded view of a hybrid junction double balanced three port mixer or modulators similar to that shown in FIG. 1 but constructed using strip lines or printed circuits instead of the coaxial transmission line sections shown in FIG. 1. Printed circuit baluns are known in the prior art. One example of a printed circuit balun, for example, is discussed in "A Printed Circuit Balun for Use With a Spiral Antenna," by Bower et al., IRE Trans. on Microwave Theory and Techniques, Vol. MTT–8, pp 319–325, May 1960. Design criteria for printed circuit baluns for use in the hybrid junction and double balanced mixer or modulator of this invention are generally the same as for coaxial transmission line section baluns. A strip line or printed circuit board 44 has conductors 46*a* and 46*b* on one side thereof (corresponding to the outer conductors of the baluns 29 and 30 in FIG. 1). As before, the conductors 46*a* and 46*b* are open-circuited intermediate the ends thereof and grounded at their respective ends. A dielectric layer 47 separates the conductors 46*a* and 46*b* from two conducting strips 48 and 49 which correspond respectively to the inner conductors of baluns 30 and 29 in FIG. 1. The strips 48 and 49 are connected in parallel at their first ends to form a terminal 2 which in connection with terminal 2' connected to the conductor 46*a* and 46*b* forms a port 2.

Similarly, a printed circuit board or strip line arrangement 51 has conductors 52*a* and 52*b* on one side thereof which is open-circuited intermediate the ends thereof and grounded at the ends thereof. A dielectric layer 53 separates the conductors 52*a* and 52*b* from two strip lines 54 and 55 which correspond respectively to the inner conductors of baluns 27 and 28 in FIG. 3. The strip lines 54 and 55 are connected in parallel at their first ends to form a terminal 1 which, in conjunction with the terminal 1' which is connected to the conductors 52*a* and 52*b* constitute a terminal pair defining a port 1. The open-circuited conductors 46*a*, 46*b* form four terminals 56, 57, 58 and 59 which are respectively connected to four terminals of the open-circuited conductors 52*a*, 52*b* labeled 60, 61, 62 and 63. The connection of these terminals between the conductors 46*a*, 46*b* and 52*a*, 52*b* constitute a terminal pair labeled 3 and 3' which define a third port and a terminal pair labeled 4 and 4' which constitute a fourth port of the hybrid junction. To form a double balanced three port double balanced mixer or modulator, a star diode arrangement is interconnected between the terminals 3 and 3' and 4 and 4' to a common terminal C (conducting post 70). These diodes are labeled 64 through 67 in FIG. 3. One end of each diode is connected to the common terminal C and the other end of each diode is connected to one of the terminals of the third and fourth ports, the diodes being oriented in opposed conduction direction to each other across each of the third and fourth ports and being further oriented in a conduction direction to the third port which is opposite that of the fourth port. That is, orientation is such that pairs of diodes connected across a third or fourth port (diagonal) terminal pair are in opposed conduction, whereas diode pairs connected across terminals, one of which is a third port terminal, the other of which is a fourth port terminal (adjacent terminals) are in a conduction direction.

Figure 4:
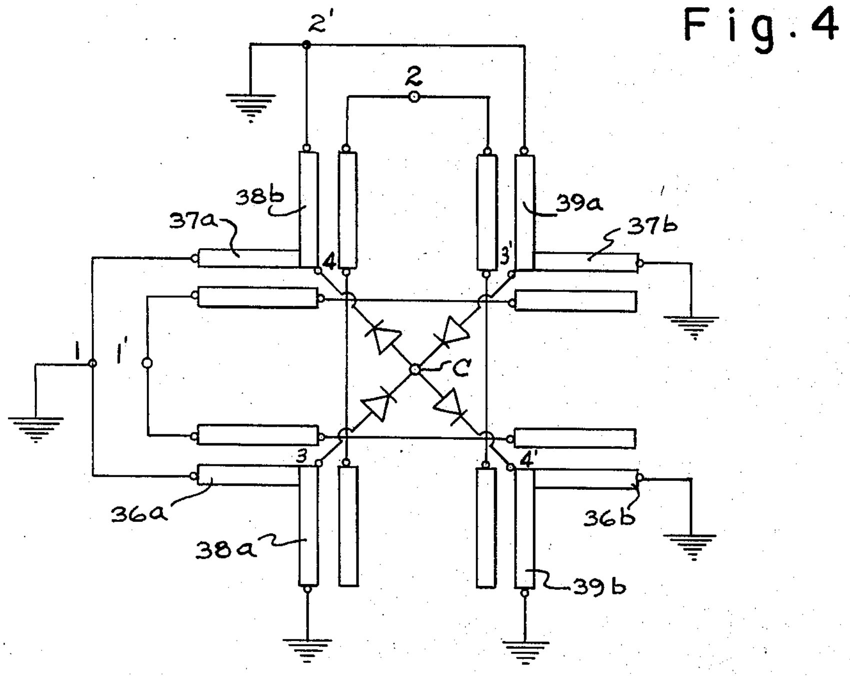
FIG. 4 is a schematic electrical diagram of the hybrid junction coupled double balanced mixer or modulator of FIG. 1 or FIG. 3.

FIG. 4 is a parallel wire or 2-wire transmission line representation of a hybrid junction coupled, double balanced mixer or modulator constructed in accordance 2-wire this invention and utilizing compensated baluns. The reference numerals correspond to the inner and outer conductors of the coaxial transmission line embodiment and have been applied to the 2transmission line representation of FIG. 4 for ease in analysis thereof. As can be seen, the hybrid junction in FIG. 4 has two input ports having respective terminal pairs 1 and 1' and 2 and 2'. The baluns form two additional terminal pairs 3 and 3' and 4 and 4' which respectively define third and fourth ports. A star diode arrangement is interconnected between the third and fourth ports of the hybrid junction and a common output port C and forms a balanced three port mixer or modulator.

Figure 5:
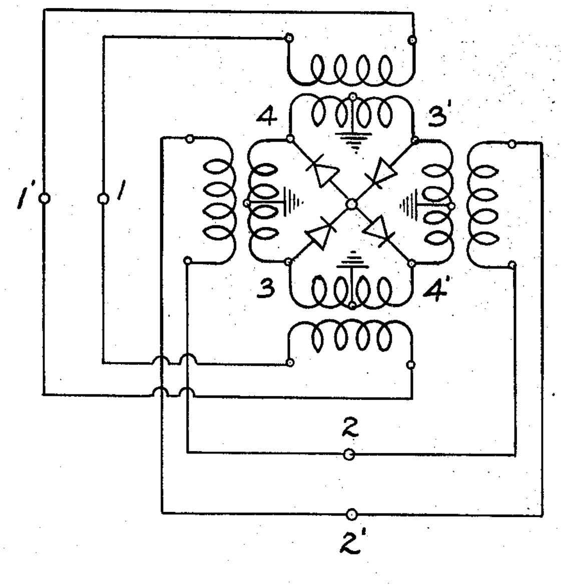
FIG. 5 is an equivalent circuit electrical diagram of the bybrid junction coupled double balanced mixer or modulator of FIGS. 1 or 3.

FIG. 5 is a lumped element (low frequency) equivalent circuit diagram of the circuit schematic shown in FIG. 4 and illustrates the approximate electrical equivalent between the balun hybrid junction and the hybrid junction constructed using mutually inductively coupled transformers as described in U.S. Pat. No. 3,512,090 previously referred to. As pointed out hereinbefore, however, since in the balun embodiment there is no direct connection between the inner conductors of the coaxial transmission line sections for example and the diodes, there is a significant reduction in series inductance in the circuit so that the resonance of the circuit is raised above 20 GHz, enabling operation of the circuit over frequency bands of, for example, 10 to 20 GHz.

I claim:

1. In an electromagnetic hybrid junction, first, second, third and fourth baluns, each of said baluns including a first and second ends and further each of said baluns comprising a conductor pair forming transmission lines in which one conductor of said pair is grounded at both said first and second ends and has an open-circuited portion intermediate said first and second ends, said conductor pairs of each of said first, second, third and fourth baluns being open-circuited with respect to each other at said second ends thereof, said balun being formed thereby into a first impedance matching portion and a second compensating portion connected in series with each other and separated by said open-circuited portion, means connecting said first ends of the other conductor of said first and second baluns in parallel to form a first port to the junction, means connecting said first ends of the other conductor of said third and fourth baluns in parallel to form a second port to the junction, means connecting said one conductor of said conductor pair of said first balun at its portion electrically contiguous to its first end to said one conductor of said conductor pair of said third balun at its portion electrically contiguous to its second end, and means connecting said one conductor of said conductor pair of said second balun at its portion electrically contiguous to its second end to said one conductor of said fourth balun at its portion electrically contiguous to its first end whereby terminal pairs are formed defining a third port, means connecting said one conductor of said conductor pair of said second balun at its portion electrically contiguous to its first end to said one conductor of said conductor pair of said third balun at its portion electrically contiguous to its first end and means connecting said one conductor of said terminal pair of said first balun at its portion electrically contiguous to its second end to said one conductor of said fourth balun at its portion electrically contiguous to its second end whereby terminal pairs are formed defining a fourth port.

2. A hybrid junction as in claim 1 wherein each of said baluns comprises transmission line sections each having at least a strip conductor and one ground plane conductor separated by dielectric and wherein said ground plane conductor has an open-circuited portion intermediate its first and second ends.

3. A hybrid junction as in claim 1 wherein each of said baluns comprises a coaxial wire transmission line section having an inner conductor and a coaxial outer conductor and wherein said coaxial outer conductor has an open-circuited portion intermediate its first and second ends.

4. A hybrid junction as in claim 1 including a star diode network consisting of at least four diodes connected together in star configuration in which one end of each diode is connected to a common terminal and the other end of each diode is connected to one of the terminals of said third and fourth ports, said diodes being oriented in opposite conduction direction to each other across each of said third and fourth ports and being further oriented in a conduction direction at the third port which is opposite that of the fourth port, said diodes and hybrid junction together forming a double balanced three port mixer or modulator.

5. A hybrid junction as in claim 2 including a star diode network consisting of at least four diodes connected together in star configuration in which one end of each diode is connected to a common terminal and the other end of each diode is connected to one of the terminals of said third and fourth ports, said diodes being oriented in opposed conduction direction to each other across each of said third and fourth ports and being further oriented in a conduction direction at the third port which is opposite that of the fourth port, said diodes and hybrid junction together forming a double balanced three port mixer or modulator.

6. A hybrid junction double balanced mixer or modulator as in claim 5 wherein each of the electrically contiguous portions of said ground plane is approximately one-fourth wave length for signals at the center frequency of the desired frequency band of operation.

7. A hybrid junction as in claim 3 including a star diode network consisting of at least four diodes connected together in star configuration in which one end of each diode is connected to a common terminal and the other end of each diode is connected to one of the terminals of said third and fourth port, said diode being oriented in opposed conduction direction to eachother across each of said third and fourth ports and being further oriented in a conduction direction at the third port which is opposite that of the fourth port, said diodes and hybrid junctions together forming a double balanced three port mixer or modulator.

8. A hybrid junction coupled, double balanced mixer or modulator as in claim 7 wherein each of the electrically contiguous portions of said ground planes is approximately one-fourth wave length for signals at the center frequency of the desired frequency band of operation.

* * * * *